United States Patent [19]

Bennett

[11] 3,861,023

[45] Jan. 21, 1975

[54] FULLY REPAIRABLE INTEGRATED CIRCUIT INTERCONNECTIONS

[75] Inventor: Barry Bennett, Carson, Calif.

[73] Assignee: Hughes Aircraft Company, Culver City, Calif.

[22] Filed: Apr. 30, 1973

[21] Appl. No.: 356,010

[52] U.S. Cl. ........................ 29/574, 29/575, 29/577

[51] Int. Cl. ............................................ B01j 17/00

[58] Field of Search ........ 29/574, 577 IC, 577, 578, 29/628, 575

[56] References Cited

UNITED STATES PATENTS

| | | | |
|---|---|---|---|
| 3,377,513 | 4/1968 | Ashby | 29/577 IC |
| 3,508,325 | 4/1970 | Perry | 29/577 |
| 3,641,661 | 2/1972 | Canning | 29/574 |
| 3,771,217 | 11/1973 | Hartman | 29/577 |

*Primary Examiner*—Roy Lake
*Assistant Examiner*—Tupman
*Attorney, Agent, or Firm*—W. H. MacAllister, Jr.; Lewis B. Sternfels

[57] ABSTRACT

A 100 percent rework capability on the third level metal enables corrections for failures of first level metal logic elements after multilevel processing, while further reducing the recurring large scale integration. All first level metal pads or primary signal connects are brought to the third level metal, through second level metal with a stacking technique so that any first level metal logic element can be wired bonded into the third level metal signal inter-connect. Any interconnection scheme may be utilized in bringing up all primary signal connects to the third level metal based on the rationale that formerly tested good circuits might become inoperative or previously tested bad circuits might test operable.

10 Claims, 8 Drawing Figures

FULLY REPAIRABLE INTEGRATED CIRCUIT INTERCONNECTIONS

BACKGROUND OF THE INVENTION

1. Field of the Invention

The present invention relates generally to integrated circuits and, more particularly, to means and methods of interconnecting a plurality of integrated circuits.

2. Description of the Prior Art

It is well-known in the semiconductor art to fabricate in a single body of semiconductor material, which is referred to as a wafer, a plurality of circuits in one or more predetermined arrays. Each circuit can, for example, include a plurality of active and passive electronic or electrical circuit elements which are electrically interconnected with one another so that the circuit will operate in a specified manner such as, for example, a digital adder or a gate. Interconnections are usually made with these circuits by conductors, or lines, which are routed to selected active and passive components formed in the metallization of each circuit. The end of these lines, wherein an interconnection is usually made, is generally formed into an enlarged signal-connect area commonly referred to as a pad.

Typically, there can be presently about four hundred discrete circuits on each one and one-half inch wafer, of which seventy-five to three hundred might be determined to be good, or otherwise usable or operable. The good circuits usually occur in an unpredictable pattern and may be clustered throughout the array. In addition, the individual circuits are relatively small and densely packed. For example, each circuit can be 0.060 inches by 0.060 inches square with possibly up to fourteen or more pads.

Heretofore, with the present state of the art, it has been difficult to interconnect the good circuits in the array with other good circuits. Furthermore, the difficulty would still exist even if the yield of good circuits approached 100 percent. In addition, interconnect difficulties would exist even with a 100 percent yield if functionally different circuits are mixed on a wafer and are located at different positions in the array or even at different positions in different batches. Still further, there is the combined problem associated with interconnecting circuits in an array of less than 100 percent yield wherein there are intermixed functionally different circuits in the same array, or even where the size of the circuits varies throughout the array or from wafer to wafer.

Heretofore, techniques have been used to provide interconnects between integrated circuits on a single wafer. One technique has been to functionally test an array for good circuits. Then a layer of insulating material with feedthroughs or vias through the pads of only selected good circuits is laid down across the array. Thereafter, alternating layers of conductors or lines and layers of insulating material having feedthroughs or apertures therethrough are formed on the wafer. The feedthroughs interconnect the pads of the good circuits to the layers of interconnect lines formed for each wafer. Since the pattern of good circuits varies from wafer to wafer, the pattern of feedthroughs and pattern of conductors in each layer has varied in position and routing from wafer to wafer in a discretionary manner. This discretionary interconnect technique could require exhaustive routing and masking operations which were customized for each wafer. As a result, the masks generated for each layer of interconnect were usable only for that single wafer because of the varying locations of good circuits.

More recently, there has been disclosed a pad relocation technique for interconnecting LSI (Large Scale Integration) arrays of imperfect yield, as set forth in copending U.S. patent application, Ser. No. 206,555, filed Dec. 9, 1971, now U.S. Pat. No. 3,795,972 patented Mar. 12, 1974 which was published as a paper in the Fall Joint Computer Conference, 1969, and in other papers. The pad relocation technique disclosed in that patent application and publication allows a predetermined standard pattern of good circuits to be established on all LSI slices used to perform the same array function regardless of the varying yield patterns determined by a direct current wafer probe test. This technique is accomplished by relocating the pads of nearby good circuits to the positions where good circuits were specified by a prescribed master pattern, but were not found during wafer probe tests. The pad positions above a bad circuit (or any unused circuit) are isolated from that circuit by a layer of dielectric. Where good circuits are found in expected good circuit locations, those circuits are used without relocation. Thus, the pad relocation technique functionally establishes a specified pattern of good circuits as if there had actually been a 100 percent circuit yield in that pattern. A single wiring pattern could then be generated for all the LSI arrays of the same function to accomplish the much more complex signal interconnect between the master pattern circuits. By determining standard crossunder areas within the pad relocation layer where relocation lines need never occur, large arrays can be interconnected with the same number of total interconnect layers as required by discretionary techniques.

Several accessory techniques and improvements on the basic pad relocation technique have been suggested, as disclosed in copending patent applications, Ser. No. 208,969, filed Dec. 16, 1971, now U.S. Pat. No. 3,795,974 patented Mar. 12, 1974, Ser. No. 211,701, filed Dec. 23, 1971 (a divisional application), Ser. No. 208,419, filed Dec. 15, 1971, now U.S. Pat. No. 3,795,973 patented Mar. 12, 1974; and Ser. No. 209,397, *filed Dec.* 17, 1971, now U.S. Pat. No. 3,795,975 patented Mar. 12, 1974. These improvements are accessories to or extensions or modifications of the pad relocation technique and relate generally to utilization of spare circuits for repair, grouping of cells by function, reduction of the number of masks, and inclusion of test points and may, in some instances, be used separate from the pad relocation technique.

Although the aforementioned inventions comprise vast improvements over discretionary wiring methods, especially for large quantity production, there has been no means provided to enable 100 percent rework capability for any failures of first level metal logic elements after multilevel processing.

Further, if it were desired to change the logic, such as resulting from a change in electrical design, it was not possible to have full capability of making such changes.

It had further been found that previously tested good circuits can become inoperative during further processing, such as through heating. Also, as a corollary, some of the processing steps, whether in reducing vias through insulation layers or in deposition of metal routing, might result in imperfections in the processed wafer, in which any malfunction was determinable only after treatment or processing. As a consequence, the wafer as processed would have to be further reworked, if possible.

It was further discovered that certain circuits which had been previously tested as inoperative were actually not inoperative but only tested as such because of faulty testing or probing procedures or that further processing converted a previously inoperable circuit into an operable circuit. In all prior techniques, once a circuit was tested as inoperative, it was forever discarded.

SUMMARY OF THE INVENTION

The present invention overcomes these and other problems by providing a method which enables 100 percent rework capability on the third level of metallization. Briefly, the present invention requires that all first level metal pads or primary signal-connect means of all circuits, whether operable or not, be brought to the third level metal or third level of metallization through a second level of metallization by stacking of pads so that any first level metal logic element may be wire bonded, stitch bonded or connected by any other means into a third level metal signal interconnect.

More specifically, the starting point of the present invention is where all the operable and inoperable circuits on a wafer are terminated in primary signal-connect means or pads at a first level of wafer metallization on each of the wafers. These primary signal-connect means are all uniformly located in parallel lines which are identically located on all of the wafers. At this point, it is presumed that a circuit diagram or at least a function diagram has been prepared of the electrical function which the wafers are to perform. If the processing is to include the previously mentioned pad relocation invention, a master pattern is then prepared which predetermines where the circuits shall be located.

The decision as to where these predetermined circuit locations are to lay is made by two decisions. Primarily, it is desired to place master pattern circuit locations in a pattern such as will meet a specific pad relocation criteria, that is, the location of cells are surrounded with a minimum of three possible relocation candidates. The secondary consideration is to locate adjacent circuits as close to each other as possible in order to minimize conductive line or lead lengths. The master pattern also reflects, but does not necessarily include, the number of circuit pads required by the type of circuit usage or function, for example, an inverter, a two input gate, a three input gate, a flip-flop, etc. Accordingly, the master pattern has predetermined circuit locations which define the desired positions of circuits and corresponding circuit usage type of the operable circuits to be selected from any of the operable circuits irrespective of their position on the wafer. These predetermined circuit locations correspond to a standardized pattern of good circuits of all of the wafers which are to be similarly processed into the electrical function.

All of the circuits are then tested at their primary signal-connect means by a probe to determine the actual positions of good and bad circuits for each and every wafer, from which testing is obtained a yield map of good and bad circuits. This yield map is distinguishable from the master pattern map because the yield map shows actual positions while the master pattern map defines the desired positions. The probe contains a number of whisker contacts and is stepped sequentially over the wafer, for example, by stepping it in columns from the top to the bottom of the wafer and then moving it from the column at the left to succeeding columns to the right. The number of whisker probes equals the number of input-output pads of the basic logic cells or circuits. From this yield map for each wafer, the bad circuits, that is, those which do not function properly, are identified on the yield map as well as the good or functioning circuits.

By using the knowledge of where the good and bad (operative and inoperative) circuits are and where the master pattern predetermined circuit locations have been decided upon, it is determined what, if any, pad relocation patterns will be needed to satisfy the predetermined locations of circuits on the master pattern. This is preferably done by a computer program; however, it is possible to manually make this decision for each wafer by graphic markings.

Using the computer program or manual markings on each wafer yield map, a second level mask is generated, which second level mask combines the second level pad relocations with second level standard information and cross-under lines. The pad relocations comprise lead lines which extend from the actual positions of the pads of operable circuits to the desired positions of the operable circuits in conformance with the master pattern predetermined circuit locations. The second level standard information includes information where all the first metal pads of both the operable and inoperable circuits are brought up to identical positions of second metal pads and busline and other standard information. In the placement of these second metal pads, their positions are moved to positions directly above first metal pad positions and adjacent to the master pattern positions, where applicable. The cross-under lines are not intended at this point to have any connection but are placed in available, otherwise unused positions to enable interconnections at a further level.

An insulation layer, such as of glass or silicon dioxide, is placed over the first level of metallization with vias extending to all of the pads on the first level by conventional masking and glass removal techniques. metallization with pads, pad relocation lines, cross-under lines and buslines are routed from the first level of metallization through the vias to the second level, using the second level mask in conjunction with conventional masking and metal removal techniques.

At this point on the second metallization level, there exists (1) second level pads directly above the first level pads, (2) all pads defining the desired positions of the operable circuits conforming to the predetermined circuit locations of the master pattern, and (3) all leads from the second level pads to master pattern pads including relocation lines from good circuit pads to bad circuit locations corresponding to master pad locations and good circuit pads to adjacent master pattern pads, in addition to buslines, power lines, cross-under lines, etc.

A second level dielectric layer of insulation is then laid down with vias therein to the second level metallization by using a mask which is identical for all wafers. These vias expose all pads of the second metal, including the pads of inoperative circuits as well as operative circuits, master pattern pads, cross-under line pads, and power and ground connection points.

A third level of metallization is then laid over the second level dielectric layer with interconnections to the second level pads through the second level vias. The third level of metallization include pads for grounding connections, power connections, input and output connections, bonding, and alignment.

It is to be understood that, although a particular pad relocation technique has been described in addition to bringing all first metal pads to the third level of metallization, any other interconnection scheme is as suitable and the present invention is not to be considered as applicable only to the pad relocation technique. Furthermore, although standardization for all wafers has been accomplished at the second level of metallization, such standardization is not required at this second level of metallization. For example, the metallization occurring at the second and third levels of metallization can be exchanged without departing from the concepts of the present invention, or other patterns can be used.

The wafer is then backbonded to a substrate support and the input-output points are wire bonded to substrate connections.

The total function of the entire wafer is then tested. If the wafer tests good, then it is used in the electronic system for which it is intended. If the tests show some malfunction, diagnositc testing is then conducted to find the faults. Repair of the faulty circuits is conducted in a manner which depends upon the type of fault.

If the fault is an open line, closed via or the like, a wire bond is used to bridge the open segments. Also, since all first level pads have been brought up to the third level level, it is possible to wire bond from third level pads above the first level pad to a desired third level master pattern pad. This wire bonding assumes that the fault is in the master pattern pad or a lower level connection thereto.

If the fault is a bad circuit function, it is necessary to look for the closest good circuit. All connections to the faulty circuit are then cut and wires are bonded into the closest good circuit to leads coming from the master pattern pads.

If the fault relates to a faulty circuit design or requires a change in the design of the wafer function, where, for example, more circuit functions are required, it is now possible to place into the actual circuit any unused good circuits by wire bonding.

It is, therefore, an object of the present invention to provide 100 percent rework capability on a wafer.

It is another object of the present invention to provide improvements in making electrical connections between integrated circuitry components.

Another object is to provide improved means and method for terminating randomly distributed circuits in a standard pattern.

Another object is to provide simplifications in the means and methods of making electrical connections between a plurality of circuits and an integrated circuit array which are unpredictably located or variably located from wafer to wafer.

Another object is to enable changes in circuit function.

Another object is to provide a capability of utilizing all wafer circuits, including those which may have at one time been previously tested inoperative.

Another object is to enable pad relocation to be cheaper, easier and more reliable.

BRIEF DESCRIPTION OF THE DRAWINGS

Other aims and objects as well as a more complete understanding of the present invention will appear from the following explanation of an exemplary embodiment and the accompanying drawings thereof in which.

As a preliminary matter, it is to be understood that the present invention is not a pad relocation technique and may be used with any technique, whether discretionary or pad relocation or otherwise; however, it is useful in pad relocation as it reduces costs and makes such technique easier to carry out and more reliable in its end results.

It is to be further understood that the following description is illustrative in describing where the wafer is divided into a number of parts comprising one or more cells or circuits; however, the philosophy of the present invention is as applicable for any circuit, division thereof or group of circuits. It is merely for the sake of convenience, both in describing the present invention hereinafter and in the actual processing of the present invention, that each wafer division is broken into a rectangular configuration comprising a plurality of devices or elemental logic circuits.

Figure 2:
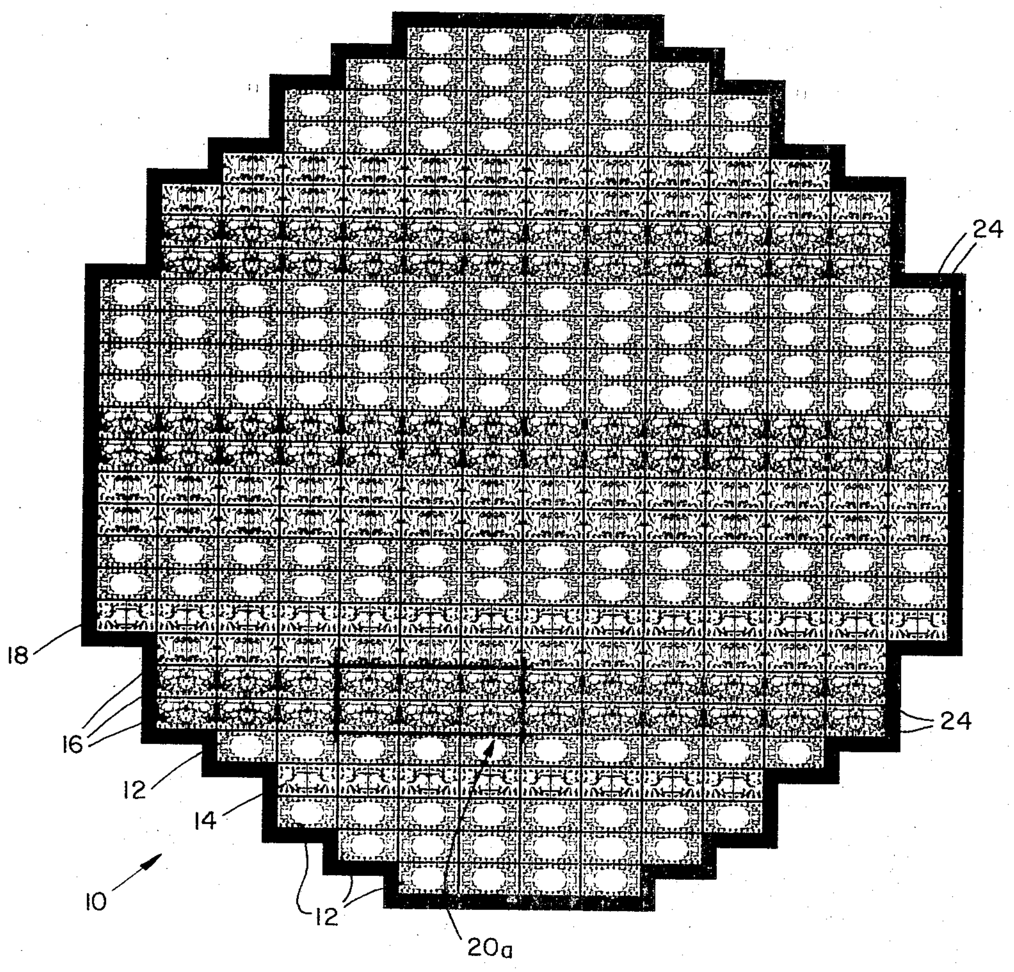
FIG. 2 is a view at the first level of metallization of a wafer to be processed according to the teachings of the present invention.

Accordingly, the starting point for the present invention is a partly processed wafer 10 at its first level of metallization, as shown in FIG. 2. This wafer comprises, for example, an appropriately doped silicon substrate, or other suitable substrate, into which has been diffused, ion implanted or otherwise, a plurality of circuit elements and over which is placed a layer of insulation, such as of silicon dioxide, with feedthroughs therethrough. A first level of metallization configures the individual components into basic logic elements or circuits, which is depicted in FIG. 2.

These basic logic circuits may comprise any suitable type circuit and, as illustrated, these circuits are divided in vertical columns and horizontal rows in rectangularly configured divisions 12. Each division may comprise one or more basic logic circuits. Each division 12 in the first three rows and the fifth row, counting from the bottom of the drawing, includes four circuit devices, such as 3-input gates. Divisions 14 of the fourth row from the bottom include two devices such as adders and full input gates. The next three rows comprise circuit divisions 16 comprising two devices, for example, flip-flops. The next row of divisions 18 include two devices, such as AOI's (and/or inverts), in which case each division includes one full circuit or device. These types of circuits are, of course, illustrative but are taken from an actual LSI device made in accordance with the teachings of the present invention.

Figure 1:
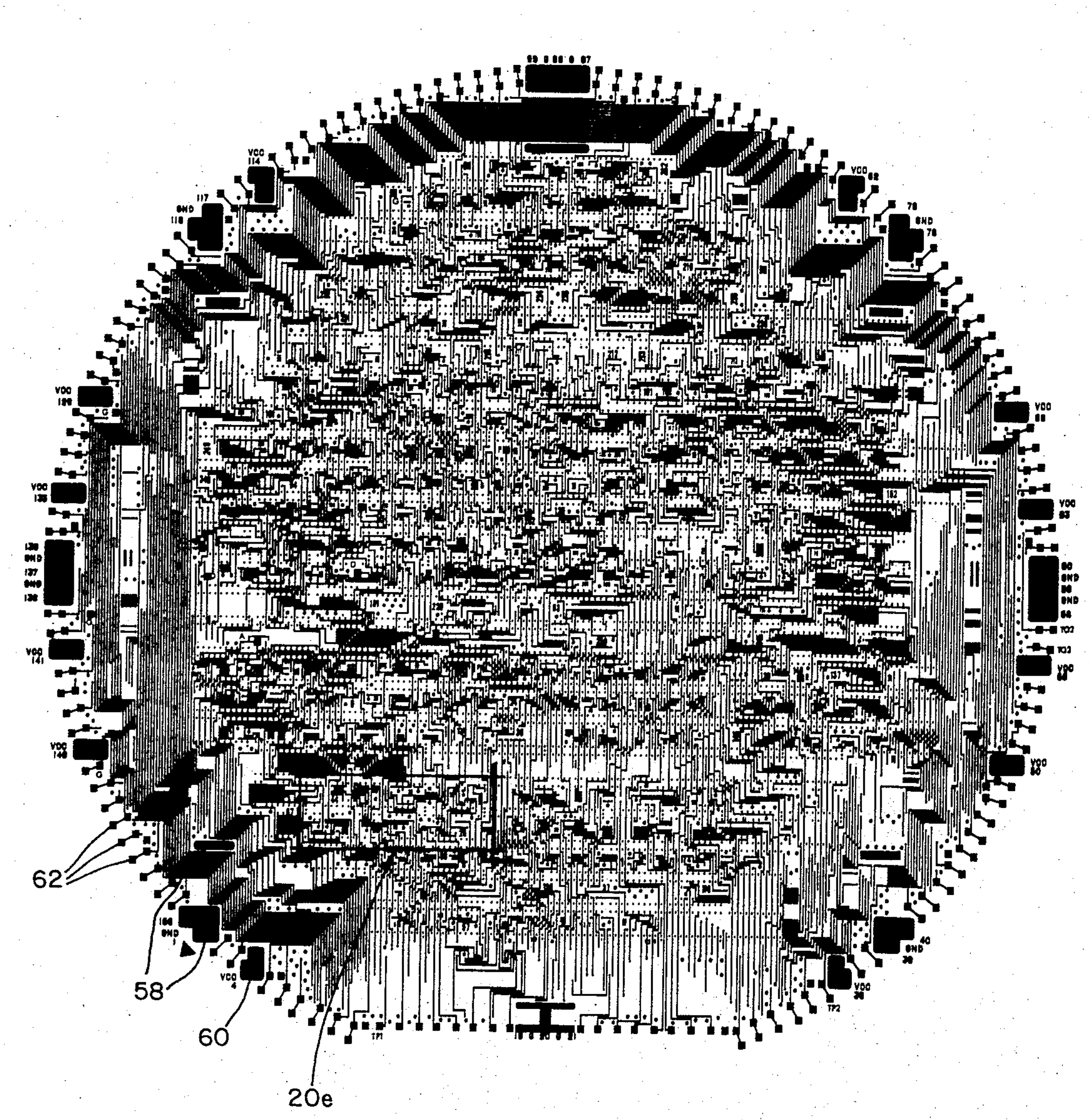
FIG. 1 is a view at the third level of metallization of a wafer processed in accordance with the teachings of the present invention.

For purposes of describing the present invention, a group 20*a* of six circuit divisions 16, comprising two circuits 17 each, has been selected for illustrating a preferred embodiment of the present invention. Circuit divisions 16 have been enlarged as shown in FIG. 3(*a*). These six circuit divisions are processed with alternate layers of insulation and metallization, shown in FIG. 3(*b*)–3(*e*) in order to obtain a completely interconnected LSI wafer shown in FIG. 1, their particular section processed from circuits 20*a* being indicated by indicium 20*e*.

Each circuit within each division 12, 14, 16, 18 etc. of wafer 10 is terminated in the plurality of pads or primary signal-connects 24. Each division 12 includes four circuits and, since the number of pads 24 in circuit division 12 numbers twenty, there are five pads per device. Each division 14 includes two circuits or devices and, since the number of pads 24 in circuit division 14 numbers twenty, each device has ten pads, the same being true of circuit division 18. Each circuit division 16, as further shown in FIG. 3(*a*), includes two circuits and fourteen pads, or seven pads per device.

In order to further facilitate the understanding and description of the present invention, the numerical references of the various parts and components of FIGS. 3(*a*)–3(*e*) will all have the same numbers but with differing letters, the letter relating to the particular figure. Therefore, pads 24 of FIG. 2 are shown generally in FIGS. 3(*a*)–3(*e*) as respective pads or feedthroughs 24*a*, 24*b*, 24*c*24*d*, and 24*e*. When it is necessary to specify a particular pad, rather than all pads generally, a different numeral will be used for clarity. For example, in order to show an alignment of the various sections 3(*a*)–3(*e*), a particular pad 26*a* is located in correspondence with pads or feedthroughs 26*b*, 26*e*, 26*d*, and 26*e*, each one of the pads or feedthroughs lying vertically one above the other, as indicated by alignment line 28.

With the following as a background, one method of carrying out the present invention, used in conjunction with the pad relocation technique as described in copending patent application, Ser. No. 206,555, (U.S. Pat. No. 3,795,972), will be described.

Figure 4:
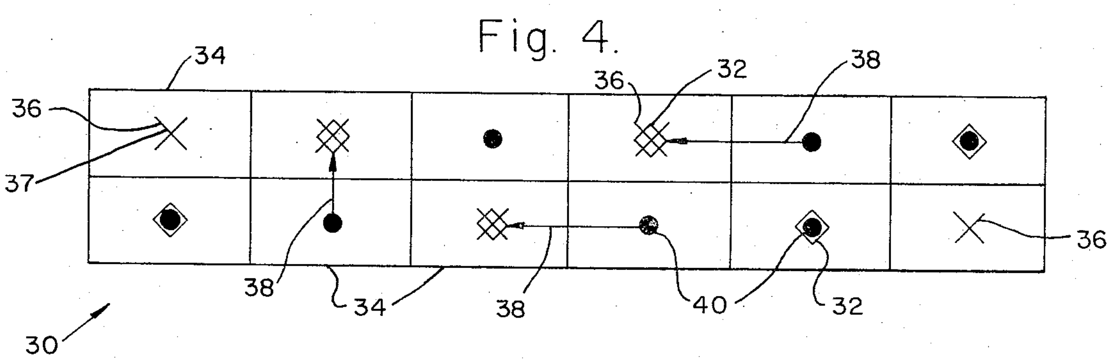
FIG. 4 is a view of a portion of master pattern useful in carrying out an ancillary aspect of the present invention.

With a wafer as shown in FIG. 2 at its first level of metallization, in accordance with the teachings of the pad relocation technique, a decision is made as to where predetermined circuit locations are to lie on a master pattern. A portion of this master pattern is depicted as a map 30, as shown in FIG. 4. For illustrative purposes, this map is of the six circuit divisions 16 shown in FIGS. 2 and 3(*a*). The predetermined circuit locations are indicated by diamonds 32. The decision for locating the predetermined circuit locations (diamonds 32) is made primarily to surround the location of cells with a minimum of three relocation candidates and secondarily to locate adjacent circuits as close to each other as possible so as to minimize line or lead lengths.

It is to be understood that each rectangle 34 of master pattern map 30 identifies a particular device and, therefore, each pair of adjacent rectangles 34 in FIG. 4 represents a single division 16. In accordance with this system, therefore, a master pattern map for the devices of circuit divisions 12 would comprise four rectangles, each rectangle representing the device which, as explained above, comprises four devices such as 3-input gates. Accordingly, the rectangle for each master pattern map references the type circuit usage or function, which is furher identified by the number of pads or primary signal-connects. An inverter requires two pads, a 2-input gate requires three pads, a 3-input gate requires four pads, etc. In FIG. 4, diamonds 32 therefore indicate the predetermined circuit locations which define the desired positions of the devices to be selected in circuit division 16 regardless of their actual position.

To find the actual positions of the devices, pads 24 of all circuits as shown in FIG. 2 are probe tested to determine where good and bad circuits reside, that is, whether a particular circuit operates to provide the desired elemental function. Such probing is done by AC and DC testing for every wafer to obtain a yield map of actual positions of operable circuits. It will be apparent that the actual positions of operable circuits will not necessarily coincide with the desired positions as defined by the predetermined circuit locations 32 on master pattern map 30. The probe contains as many whiskers as there are pads and the probe is stepped from top to bottom moving from the column at the left-hand side of FIG. 2 to succeeding columns to the right. The number of whisker probes equal the number of cells at their input and output pads. Accordingly, the yield map for each wafer is obtained. Each circuit which does not test as operative, that is, each which does not function properly, is identified on master pattern map as "X," bearing indicium 36. A good or functioning circuit is identified on map 30 as "O," bearing indicium 40.

Utilizing this knowledge of where good and bad circuits are positioned and where the master pattern circuit locations have been decided upon, it is then necessary to determine what, if any pad relocations will be required to satisfy the locations of predetermined circuits on the master pattern. This determination is most effectively accomplished by a computer program; however, if desired, this can be done manually for each wafer, although manual processing is not preferred.

This effective relocation of the actual positions of tested operable circuits to the desired positions as defined by the predetermined circuit locations of the master pattern map is depicted in FIG. 4 by arrows 38. It is to be understood that each arrow 38 represents a collection of conductive lines representing routings from the primary signal-connect means of the selected operable circuits to sites of secondary signal-connect means which are located within the desired positions. Of course, where the actual position of a good circuit, as represented by circles 40, coincide with the desired positions, as represented by diamonds 32, no relocation is required.

Using the computer program or manual markings on each wafer yield map, as shown in FIG. 4, a second level mask is generated so as to obtain a second level of metallization, as depicted in FIG. 3(*c*). This second level mask is designed to enable the production of pad relocation lines 42, cross-under lines 44, and second level standard information lines 46. In addition, all primary signal-connect pads 24a are brought up to secondary signal-connect pads 24*c* in the second level of metallization as shown in FIG. 3(*c*), through feedthroughs 24*b* of FIG. 3(*b*), including those pads which are associated with circuits which have not tested as properly functioning. The mask also includes means for producing lines 42, 44 and 46 as well as for bringing up all the pads. As a consequence, pads 48*a* of non-functioning device, shown in FIG. 3(*a*), are brought up to pads 48*c*, shown in FIG. 3(*c*). It will be noted that pads 48*a* define that device represented by the X bearing indicium 37 of FIG. 4. Finally, those pads of functioning circuits whose actual positions coincide with the desired positions have their pads moved to positions adjacent their first level pad positions, as shown by lines 50 of FIG. 3(*c*). These line are also included on the mask generated from the master pattern map and yield map as depicted in FIG. 4.

It is useful to note from FIG. 3(*c*) that none of the conductive lines intersect, that pads of functioning circuits, whose actual positions coincide with their desired positions are moved to positions adjacent the primary signal-connect pads but with both pads brought to the second level of metallization, and that the second level of metallization includes buslines which are shown as heavy parallel lines as shown in FIG. 3(*c*).

Figures 3A, 3B, 3C, 3D, 3E:
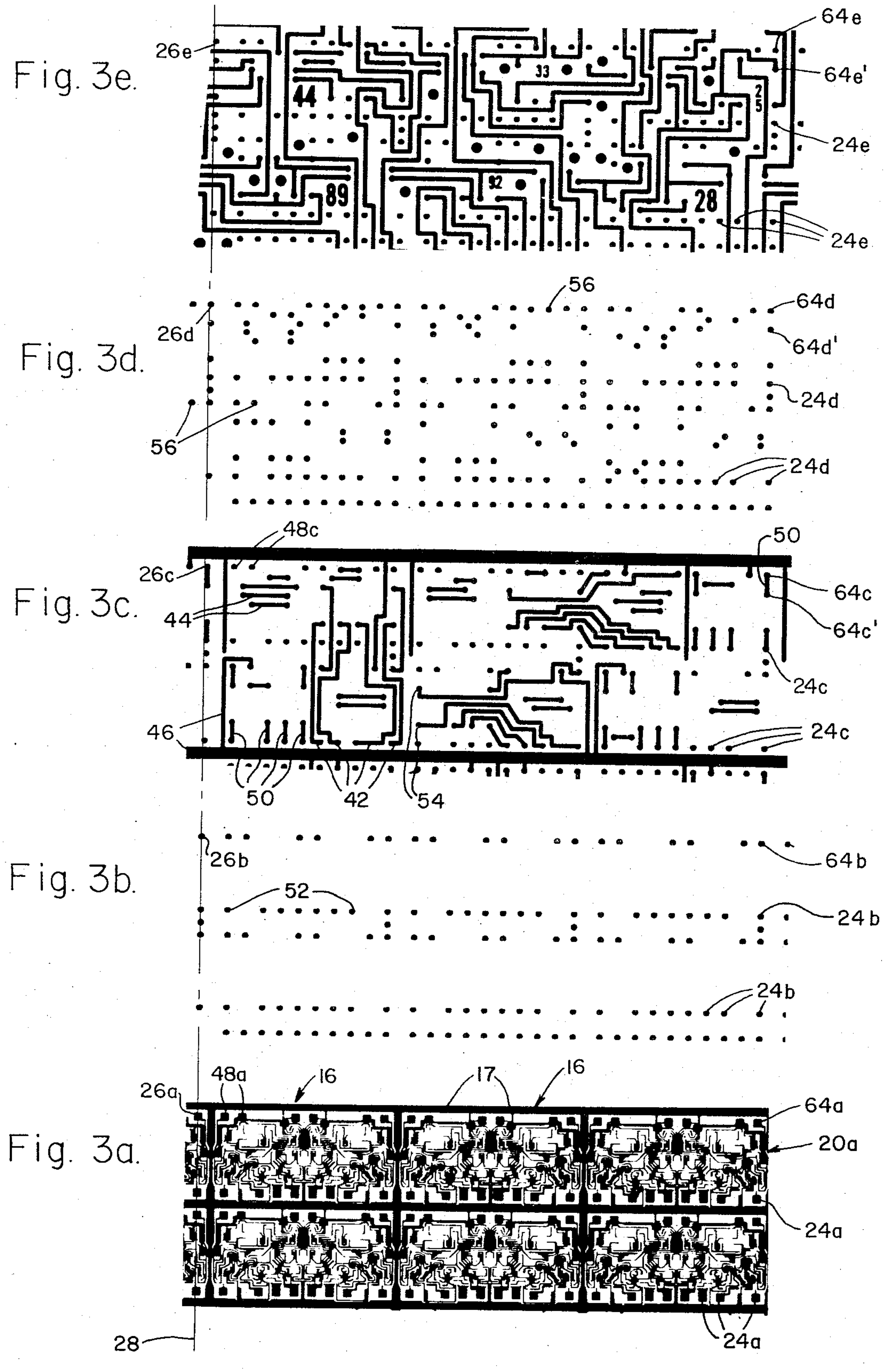
FIGS. 3(*a*)–3(*e*) are views of the wafers taken along the rectangular cuts shown in FIGS. 1 and 2, FIG. 3(*a*) showing the rectangular section taken from FIG. 2 and FIG. 3(*e*) showing the rectangular portion of FIG. 1.

In order to obtain the actual second level metallization depicted in FIG. 3(*c*), a layer of insulation, such as of silicon dioxide, is placed over the first level of metallization with vias therein extending to all of the pads in the first level. Such deposition of the insulation layer is formed by conventional masking and glass removal techniques and produces a series of vias or feedthroughs 52, as shown in FIG. 3(*b*). Metallization is then routed by use of the mask generated from the FIG. 4 map to include all pads 24*c*, relocation lines 42, cross-under lines 44, standard information lines including buslines 46, from the first level pads 24*a* through vias 52 (FIG. 3*b*) to the second level. This process of metallization is accomplished by conventional masking and metal deposition and removal techniques. It is to be noted that vias 52 of FIG. 3(*b*) after metallization no longer comprise holes but are filled with metal and, therefore, if FIG. 3(*b*) is taken to be a cross-section of the completely processed wafer parallel to the water surface, indicia of 52 will disclose metal rather than holes or vias.

At this point depicted by FIG. 3(*c*) at the second level of metallization, there exists a plurality of metal deposits. These deposits include (1) second level pads 24*c*, which includes those pads identified by indicia 26*c* and 48*c* and which lie directly above their first level pads or primary signal-connect means, (2) all master pattern pads, such as are identified by indicia 54, and (3) all leads 24 and 50 from second level pads 24*c* of functioning circuits to master pattern pads 54, the latter leads 50 extending from good device pads to master pattern pads of good circuits whose actual and desired positions coincide and leads 42 for those good circuits whose actual positions had to be effectively relocated to desired positions corresponding to master pattern predetermined circuit locations. It is to be understood further that the metallization as shown in FIG. 3(*c*) includes the ground metallization system, power busses, and power bus pads.

Thereafter, a second level dielectric with vias 56 therethrough, as shown in FIG. 3(*d*), is laid over the second metal as depicted in FIG. 3(*c*) by utilizing a mask shaped to provide the vias in FIG. 3(*d*). These vias 56 expose all pads of the second level of metallization including the pads of those devices which have tested as non-functioning as well as those devices functioning properly, along with master pads, cross-under pads, and power ground pads.

A third level of metallization or third metal is then laid over the insulation layer of FIG. 3(*d*) with vias therein to connect to the second level pads. The result of this metallization is depicted in FIG. 3(*e*) and FIG. 1. The interconnections performed at the third level of metallization not only interconnect all of the selected operable circuits but also shown ground pads 58, power pads 60, input-output pads 62, and any other metal deposits as are necessary.

At this point, the wafer as so processed is back bonded to a substrate support and the input-output pads 62 are wire bonded to substrate connectors.

The total function of the entire wafer is then tested. If the wafer function test properly, then it is placed in the system for which it is intended. If the total wafer function tests in some malfunctioning manner, the wafer is subjected to diagnostic testing to locate the faults. Repair of the faults depends upon the type of fault found.

If the fault is an open line, closed via or the like, the open circuits are then wire bonded. Because all of the first level pads 24*a* have been brought up to the third level of metallization at pads 24*e*, it is possible to wire bond from the corresponding pads lying above its first level pad to its adjacent master pattern pads. For example, let it be assumed that pad 64a has been brought up through via 64*b* to second signal-connect means or pad 64*c* and master pad or secondary signal-connect means 64*c'* which in turn have both been brought up through vias 64*d* and 64*d'* respectively to third signal-connect pad position 64*e* and tertiary signal-connect pad 64*e'*. If it is found that the fault lies within any of the connections underlying tertiary signal-connect pad 64*e'*, it is only necessary to make a connection to third signal-connect pad 64e in order to cure the fault. The same reasoning is true for any relocated device since the primary signal-connect means 24*a*, which have been relocated through lines 42 to master pad positions 54, are brought up along with the master pad positions.

If the type of fault is a bad circuit function, it is only necessary to look for the closest good circuit. When this is done, all connections to the tertiary signal-connect master pattern pads of the faulty circuit are cut at the third level of metallization and the closest good circuit third signal-connect pads 24*e* are wire bonded to the master pad positions of the faulty circuit, the reason that the connection is made to the master pattern pads is that the other pads lying directly above the faulty circuit primary signal-connect pads 24*a* are still connected to the faulty circuit.

If the fault resides in the design or a minor change in design is required so as to change the wafer function, it may be required that more circuit functions are needed. If so, it is now possible to electrically interconnect any unused functioning circuits by wire bonding means.

Further, because all circuits, whether originally tested as functioning or malfunctioning, at the first level of metallization as shown in FIG. 2, have been brought up to the third level of metallization whether through their primary signal-connect means from pads 24*a* to 24*e* or to master pad positions 64*a* to 64*e'*, it is possible that a previously tested functioning circuit may test as malfunctioning because of the various processing techniques through which the wafer is subjected. Also, some previously tested malfunctioning circuit at the first level of metallization might test as a functioning circuit at the third level of metallization due to defective testing or probing at the first metal level. Regardless of whatever reason that a circuit may have been tested in a malfunctioning manner at its third level of metallization, every other unused circuit, whether previously tested as functioning or malfunctioning, is available to replace that malfunctioning circuit to provide extra circuits in case such are needed. This is true whether or not the above described pad relocation technique has been utilized or that some other technique for interconnecting circuits has been utilized.

Finally, because the present invention requires that all primary signal-connect pads be brought up to the third level of metallization, there are no constraints as to the order of using masks which, therefore, may be used in that order which is best suited to the processing required.

Although the invention has been described with reference to the particular embodiment thereof, it should be realized that various changes and modifications may be made therein without departing from the spirit and scope of the invention.

What is claimed is:

1. An integrated circuit interconnection method for interconnecting operable circuit devices into an integrated electrical function on each of a plurality of integrated circuit wafers and for enabling each wafer to perform the same electrical function, comprising the steps of:

forming over substantially the entire surface of each wafer a plurality of substantially uniformly distributed circuit devices, some of which being operable and the remainder being inoperable, the operable and inoperable circuit devices having elemental logic functions and having random positions;

terminating each of the operable and inoperable circuit devices in primary signal-connect means at a first level of wafer metallization on each of the wafers, the primary signal-connect means being parallelly aligned and identically located on all of the wafers and over substantially the entire surfaces thereof and reflecting the type of logic function of the devices;

preparing a master pattern having predetermined circuit locations defining the desired positions and corresponding logic functions of operable circuit devices to be selected from any of the operable devices irrespective of their position and to be subjected to identical masking processes;

before, concurrently or after said master pattern selecting step, for each of the wafers, testing the plurality of operable and inoperable circuit devices at the primary signal-connect means to determine the actual positions of operable and inoperable circuit devices and to thereby obtain a yield map of operable circuit devices;

for each of the wafers, based upon the yield map, selecting operable circuit devices from any of the operable circuit devices irrespective of the actual positions thereof on individual ones of the wafers, the number of the selected operable circuit devices at least capable of performing the electrical function and being at least equal to the number of predetermined circuit locations of the master pattern, and the actual positions of the selected operable circuit devices coinciding to the extent possible to the predetermined circuit locations of the master pattern;

preparing a second level metallization mask incorporating sites of secondary signal-connect means, sites of second level signal-connect means, and sites of partial metal routings, the sites of the secondary signal-connect means lying in parallel relationship with one another within the desired positions defined by the predetermined circuit locations of the master pattern and being equally spaced from the sites of the second level signal-connect means lying within the desired positions, the sites of the second level signal-connect means lying substantially directly above all the primary signal-connect means, and the sites of the partial metal routings including metal line sites extending from the sites of the second level signal-connect means to the sites of the secondary signal-connect means;

for each of the wafers, electrically insulating the operable and inoperable circuit devices and their primary signal-connect means from one another to form a first insulation layer thereover, with first feedthrough means in the first insulation layer opening to all of the primary signal-connect means of all of the operable and inoperable circuit devices;

for each of the wafers, constructing a second level of metallization utilizing the second level metallization mask by laying down the secondary signal-connect means, the second level signal-connect means and the partial metal routings and thereby electrically coupling and routing the primary signal-connect means of all of the operable and inoperable circuit devices through the feedthrough means to the sites of the second level signal-connect means and therefrom to the secondary signal-connect means for redundantly terminating each of the selected operable circuit devices in the identical desired positions corresponding to the predetermined circuit locations of the master pattern, and for terminating each of the primary signal-connect means at the second level signal-connect means in parallel positions on the second level of metallization identically located on all of the wafers;

preparing a tertiary level metallization mask identical for all of the wafers incorporatng sites of tertiary signal-connect means, sites of third level signal-connect means and sites of further metal routings, the sites of the tertiary signal-connect means and the third level signal-connect means lying substantially directly above their respective secondary signal-connect means and their second level signal-connect means for redundant termination of the tertiary and the third level signal-connect means, and the further metal routings corresponding to a final interconnection scheme for effecting the electrical function;

for each of the wafers, placing a second electrical insulation layer over the second level of metallization including the secondary signal-connect means, the second level signal-connect means and the partial metal routings, with second feedthrough means in the second insulation layer opening to all of the secondary signal-connect means, the second level signal-connect means and the partial metal routings;

for each of the wafers constructing a third level of metallization utilizing the third level metallization mask by electrically coupling and routing the secondary signal-connect means and the second level signal-connect means of all of the operable and inoperable circuit devices through the second feedthrough means to the sites of the tertiary signal-connect means and the third level signal-connect means, for redundantly terminating each of the secondary and the second level signal-connect means, and by laying down the further metal routings in electrical interconnection with the secondary signal-connect means of the selected operable circuit devices corresponding to the predetermined circuit locations of the master pattern, in a manner for enabling performance of the electrical function;

back bonding each of the wafers to a substrate support and wire-bonding some of the tertiary signal-connect means corresponding to electrical input and output signal connections to connectors on the substrate;

testing the total electrical function of each of the wafers to determine the functioning and any malfunctioning thereof in accordance with the electrical function, including diagnostic testing of the electrical function of each of the malfunctioning wafers to identify faulty ones of those previously tested selected operable circuit devices and to identify faulty metallization of those previously tested selected operable circuit devices contributing to the cause of malfunction; and repairing any of the malfunctioning wafers by electrically isolating the faulty ones of those previously tested selected operable circuit devices and electrically coupling other operable circuit devices not previously selected at their third level signal-connect means into the third layer of metallization in place of those previously tested faulty ones of the isolated selected operable circuit devices, and by electrically isolating the faulty metallization and electrically coupling the third level signal-connect means to the tertiary signal-connect means.

2. An integrated circuit interconnection method for interconnecting operable circuit devices into an identical integrated elecrical function on each of a plurality of circuit wafers, each of the wafers having formed over substantially the entire surface thereof a plurality of operable and inoperable circuit devices in random positions, and each of the operable and inoperable circuit devices having primary signal-connect means associated therewith in a first level of metallization, comprising the steps of:

constructing second and third levels of metallization coupled to all of the primary signal-connect means on each of the second and third levels and substantially above the primary signal-connect means through redundant feedthrough means in insulation means between the second and third levels of metallization on each of the wafers for connecting the primary signal-connect means of all of the operable and inoperable circuit devices to signal-connect means and additional signal-connect means redundant thereto on the third level of metallization, in an interconnection scheme capable of interconnecting selected ones of the operable circuit devices into the electrical function on the third level of metallization;

testing each of the wafers and the circuit devices thereon at the signal-connect means on the third level of metallization and determining from said testing any wafers not properly performing the electrical function, and further determining from said testing the operable and inoperable ones of the circuit devices and any faulty parts of the redundant interconnections; and replacing any of selected ones of the operable circuit devices which have been tested inoperable with any of the operable circuit devices not previously selected, at their signal-connect means on the third level of metallization, and replacing the faulty parts of the redundant interconnections with non-faulty corresponding parts of the redundant interconnections.

3. A method as in claim 2 wherein said constructing step includes the steps of:

selecting a number of the operable circuit devices sufficient in number for performing the electrical function;

laying down pairs of signal-connect means on the second level of metalization and interconnecting each pair of the signal-connect means to the primary signal-connect means of the selected operable circuit devices for forming a portion of the redundant interconnections; and connecting each of the pairs of the signal-connect means on the second level of metallization to their corresponding signal-connect means on the third level of metallization for forming a further portion of the redundant interconnections.

4. A method as in claim 3 further including the steps of:

preparing a master pattern having predetermined circuit locations for defining the desired positions of operable circuit devices to be selected from any of the operable circuit devices and to be subjected to identical masking processes;

testing the plurality of operable and inoperable circuit devices at the primary signal-connect means for determining the actual positions of operable and inoperable circuit devices;

comparing the actual positions of the tesed operable circuit devices with the desired positions defined by the predetermined circuit locations of the master pattern;

selecting operable circuit devices from any of the tested operable circuit devices irrespective of their portion on the wafer; and coupling the primary signal-connect means of each of the selected operable circuit devices to each pair of the second signal-connect means on the second level of metallization.

5. An integrated circuit interconnection method for interconnecting circuit devices formed substantially throughout a substrate into an electrical function, each of the circuit devices having primary signal-connect means, comprising the steps of:

placing insulation means over all of the circuit devices and the substrate;

forming feedthrough means defining open vias in the insulation means to the primary signal-connect means of all of the circuit devices for exposing the primary signal-connect means thereof, without regard to the operability and inoperability of the circuit devices;

constructing metal level means on the circuit devices including redundant connection means on and above the insulation means and through the feedthrough means in the insulation means above the circuit devices to the primary signal-connect means of all of the circuit devices and interconnecting by said constructing at least some of the circuit devices into the electrical function through the redundant connection means;

testing all of the circuit devices at the metal level means for determining their operability and testing the electrical function of the interconnected circuit devices for determining the proper performance thereof; and repairing any malfunctioning of the electrical function by coupling any of the remaining portion of the redundant connection means having properly performing connections to operable circuit devices.

6. An integrated circuit interconnection method for interconnecting circuit devices having primary signal-connect means into an electrical function with one-hundred percent repair capability, comprising the steps of:

forming insulation means over all of the circuit devices;

forming means for defining redundant feedthrough vias through the insulation means to each and every one of the primary signal-connect means of all of the circuit devices without regard to their operability and inoperability;

constructing metal level means including metal interconnection means and a top level of metallization on and to the primary signal-connect means of all of the circuit devices through the redundant via means for terminating all of the circuit devices at the top level of metallization in means for defining top level signal-connects redundant to each and every one of the primary signal-connect means and for integrating a number of the circuit devices into electrical circuit means capable of performing the electrical function;

testing all of the circuit devices at the top level of metallization for determining the operability and any existing causes of inoperability of the circuit devices, the electrical circuit means, and the metal interconnecting means; and repairing the causes of inoperability when existing.

7. A method as in claim 6 wherein the cause of the inoperability comprises a faulty circuit function of one or more of the circuit devices and wherein said repairing step comprises the step of electrically coupling an appropriate number of operable circuit devices other than the integrated number in place of the one or more circuit devices exhibiting the faulty circuit function.

8. A method as in claim 6 wherein the cause of the inoperability requires a change in design of the electrical function and wherein said repairing step comprises the step of electrically coupling an appropriate number of operable circuit devices other than and in excess of the integrated number.

9. An integrated circuit method for determining the operability and inoperability of a plurality of circuit devices having means defining electrical coupling pads, comprising the steps of:

insulating all of the circuit devices and providing at least duplicate feedthrough means to each of the coupling pad means of all of the circuit devices without regard to proper functioning of the circuit devices;

placing means defining conductive material through the duplicate feedthrough means to each of the coupling pad means of all of the circuit devices and extending the metal level means from all of the circuit devices to a level of metallization above the circuit devices for providing at least duplicate pads for each of the coupling pad means; and testing all of the circuit devices at the level of metallization after said placing and extending steps for determining the operability and any inoperability of all of the circuit devices.

10. An integrated circuit interconnection method for interconnnecting circuit devices into an electrical function with one-hundred percent repair capability, comprising the steps of:

forming insulation means over all of the circuit devices with means defining feedthrough vias through the insulation means to all of the circuit devices without regard to their operability and inoperability;

constructing metal level means including metal interconnection means and a top level of metallization on and to all of the circuit devices through the via means and forming additonal feedthrough means in the insulation means redundant to some of the vias means and extending the metal interconnection means therethrough, for terminating all of the circuit devices at the top level of metallization and for integrating a number of the circuit devices into electrical circuit means capable of performing the electrical function;

testing all of the circuit devices at the top level of metallization for determining the operability and any existing causes of inoperability of the circuit devices, the electrical circuit means, and the metal interconnecting means, the cause of the inoperability comprising at least one of faulty feedthrough means and metal interconnection means; and repairing the causes of inoperability when existing, said repairing step comprising at least one of the steps of electrically coupling appropriate portions of operable circuit devices other than the integrated number, appropriate portions of electrical circuit means and appropriate portions of metal interconnecting means in place of the faulty ones into the electrical circuit means.

* * * * *